(12) United States Patent
Zheng et al.

(10) Patent No.: US 11,582,844 B2
(45) Date of Patent: Feb. 14, 2023

(54) DETECTION CIRCUIT FOR DETECTING LIGHT-OFF MODES PERFORMED BY SILICON-CONTROLLED DIMMER

(71) Applicant: Shanghai Silicon Driver Semiconductor Technology Co., Ltd., Shanghai (CN)

(72) Inventors: Yue Zheng, Shanghai (CN); Wei-Ming Liao, Shanghai (CN); Xiao-Bo Hu, Shanghai (CN)

(73) Assignee: SHANGHAI SILICON DRIVER SEMICONDUCTOR TECHNOLOGY CO., LTD., Shanghai (CN)

( * ) Notice: Subject to any disclaimer, the term of this patent is extended or adjusted under 35 U.S.C. 154(b) by 279 days.

(21) Appl. No.: 16/937,072

(22) Filed: Jul. 23, 2020

(65) Prior Publication Data
US 2021/0029792 A1    Jan. 28, 2021

(30) Foreign Application Priority Data

Jul. 25, 2019  (CN) .......................... 201910676511.8

(51) Int. Cl.
*H05B 45/14*      (2020.01)
*G01R 31/44*      (2020.01)
*G01R 19/165*     (2006.01)

(52) U.S. Cl.
CPC ....... *H05B 45/14* (2020.01); *G01R 19/16528* (2013.01); *G01R 31/44* (2013.01)

(58) Field of Classification Search
None
See application file for complete search history.

(56) References Cited

U.S. PATENT DOCUMENTS

| | | | |
|---|---|---|---|
| 2015/0257219 A1* | 9/2015 | Feng | H03K 21/023 377/55 |
| 2019/0150240 A1* | 5/2019 | Yu | G01R 31/44 315/200 R |

* cited by examiner

*Primary Examiner* — Patrick Assouad
*Assistant Examiner* — Haidong Zhang
(74) *Attorney, Agent, or Firm* — Muncy, Geissler, Olds & Lowe, P.C.

(57) ABSTRACT

The invention provides a detection circuit for detecting light-off modes performed by a silicon-controlled dimmer which comprises a voltage detection circuit receiving an output signal and generating a voltage detection signal according to the output signal, and a delay circuit connected to the voltage detection circuit, receiving the voltage detection signal, and delaying the voltage detection signal in order to output a detection signal. The invention detects the output signal through the voltage detection circuit, and delays the detected voltage detection signal to output the corresponding detection signal, and then the detection signal effectively distinguishes the light-off modes performed by the silicon-controlled dimmer to meet requirements of users.

9 Claims, 10 Drawing Sheets

DETECTION CIRCUIT FOR DETECTING LIGHT-OFF MODES PERFORMED BY SILICON-CONTROLLED DIMMER

FIELD OF THE INVENTION

The invention relates to the field of LED lighting, and more specifically to a detection circuit for detecting light-off modes performed by a silicon-controlled dimmer.

BACKGROUND OF THE INVENTION

With the expansion of the application of LED lighting, monochromatic lights that originally use silicon-controlled to adjust the brightness have also begun to be replaced with lights with a switch to adjust color temperature.

Generally, there is a brightness adjustment switch and a push button switch on the silicon-controlled dimmer to turn off the light in two modes. The first light-off mode is to adjust the brightness adjustment switch to the minimum. The second light-off mode is to turn off the light through the push button switch on the silicon-controlled dimmer. For lights applied a silicon-controlled dimmer to adjust color temperature by on-off operation, the actions of these two light-off modes cannot be distinguished, so no matter which light-off mode is performed, the color temperature of the light will be switched to the next level when the light is turned on again. However, users would like to change the color temperature only through the on-off operation of the push button switch on the silicon-controlled dimmer, but to keep the color temperature unchanged while turning the brightness adjustment switch to the minimum level and then immediately back to the maximum level again. Therefore, it is necessary to distinguish correctly between the two switching modes of silicon-controlled dimmer to meet requirements of users.

SUMMARY OF THE INVENTION

The technical problem to be solved by the present technology is to provide a detection circuit for detecting light-off modes performed by a silicon-controlled dimmer in view of the above-mentioned defect of the prior art that cannot accurately distinguish between light-off modes performed by a silicon-controlled dimmer.

The technical solution adopted by the present technology to solve the technical problem of the prior art is to provide a detection circuit for detecting light-off modes performed by a silicon-controlled dimmer. The detection circuit comprises a voltage detection circuit receiving an output signal and generating a voltage detection signal according to the output signal, and a delay circuit connected to the voltage detection circuit, receiving and delaying the voltage detection signal, configured to generate a detection signal to indicate a type of light-off mode according to delayed voltage detection signals.

In one embodiment, the delay circuit includes a delay module connected to the voltage detection circuit, receiving the voltage detection signal, and delaying the voltage detection signal in order to output a delay signal, a reset module connected to the delay module, receiving the delay signal, and generating a reset signal according to the delay signal, and a counter connected to the delay module and the reset module, receiving the delay signal and the reset signal, and generating the detection signal according to the delay signal and the reset signal.

In one embodiment, the delay module includes a first delay module, a second delay module and a third delay module disposed in parallel, an input terminal of the first delay module, an input terminal of the second delay module, and an input terminal of the third delay module are all connected to an output terminal of the voltage detection circuit, an output terminal of the first delay module is connected to clock input terminals of the counter, an output terminal of the second delay module is connected to a second input terminal of the reset module, an output terminal of the third delay module is connected to a first input terminal of the reset module, and an output terminal of the reset module is connected to reset terminals of the counter.

In one embodiment, the reset module is an RS flip-flop.

In one embodiment, the counter includes a plurality of D flip-flops disposed in parallel.

In one embodiment, the counter includes a first D flip-flop, a second D flip-flop, and a third D flip-flop, wherein a clock input terminal of the first D flip-flop, a clock input terminal of the second D flip-flop, and a clock input terminal of the third D flip-flop are all connected to the output terminal of the first delay module, and wherein a reset terminal of the first D flip-flop, a reset terminal of the second D flip-flop and a reset terminal of the third D flip-flop are all connected to the output terminal of the reset module, and wherein an output terminal of the first D flip-flop is connected to a power supply terminal of the second D flip-flop, and an output terminal of the second D flip-flop is connected to a power supply terminal of the third D flip-flop, and an output terminal of the third D flip-flop outputs the detection signal, and wherein the clock input terminal of the first D flip-flop, the clock input terminal of the second D flip-flop, and the clock input terminal of the third D flip-flop are the clock input terminals of the counter, and the reset terminal of the first D flip-flop, the reset terminal of the second D flip-flop and the reset terminal of the third D flip-flop are the reset terminals of the counter.

In one embodiment, the voltage detection circuit includes a first voltage divider circuit connected to a first output terminal of a rectifier bridge and a first comparator connected to the first voltage divider circuit, and wherein the first voltage divider circuit receives a rectified signal output from the first output terminal of the rectifier bridge, and divides a voltage of the rectified signal to output a first divided voltage signal, and wherein the first comparator receives the first divided voltage signal, and outputs a first comparison signal according to the first divided voltage signal, and wherein the rectified signal is the output signal, and the first comparison signal is the voltage detection signal.

In one embodiment, the voltage detection circuit includes the voltage detection circuit includes a waveform detection circuit connected to an output terminal of a driving power source compatible with the silicon-controlled dimmer and a logic gate circuit connected to the waveform detection circuit, wherein the waveform detection circuit receives an oscillating signal output from the driving power source, and outputs a voltage signal according to the oscillating signal; and wherein the logic gate circuit performs a logic processing on the voltage signal to output a logic signal, and wherein the oscillating signal is the output signal, and the logic signal is the voltage detection signal.

Implementing the detection circuit for light-off modes of the silicon-controlled dimmer of the present invention has the following beneficial effects that the voltage detection circuit that receives the output signal and outputs the voltage detection signal according to the output signal; and the delay circuit that is connected to the voltage detection circuit, receives the voltage detection signal, and delays the voltage detection signal in order to output the detection signal. The invention detects the output signal through the voltage detection circuit, and delays the detected voltage detection signal in order to output the corresponding detection signal, and then the detection signal effectively distinguishes between the light-off modes of the silicon-controlled dimmer to meet requirements of users.

DETAILED DESCRIPTION OF THE PREFERRED EMBODIMENTS

The technical solutions in the embodiments of the present invention will be described clearly and completely in conjunction with the figures in the embodiments of the present invention. Obviously, the described embodiments are merely a part of the embodiments of the present invention, but not all the embodiments. Based on the embodiments of the present invention, all other embodiments obtained by a person having ordinary skill in the art without making inventive effort still fall within the scope are protected by the present invention.

Figure 1:
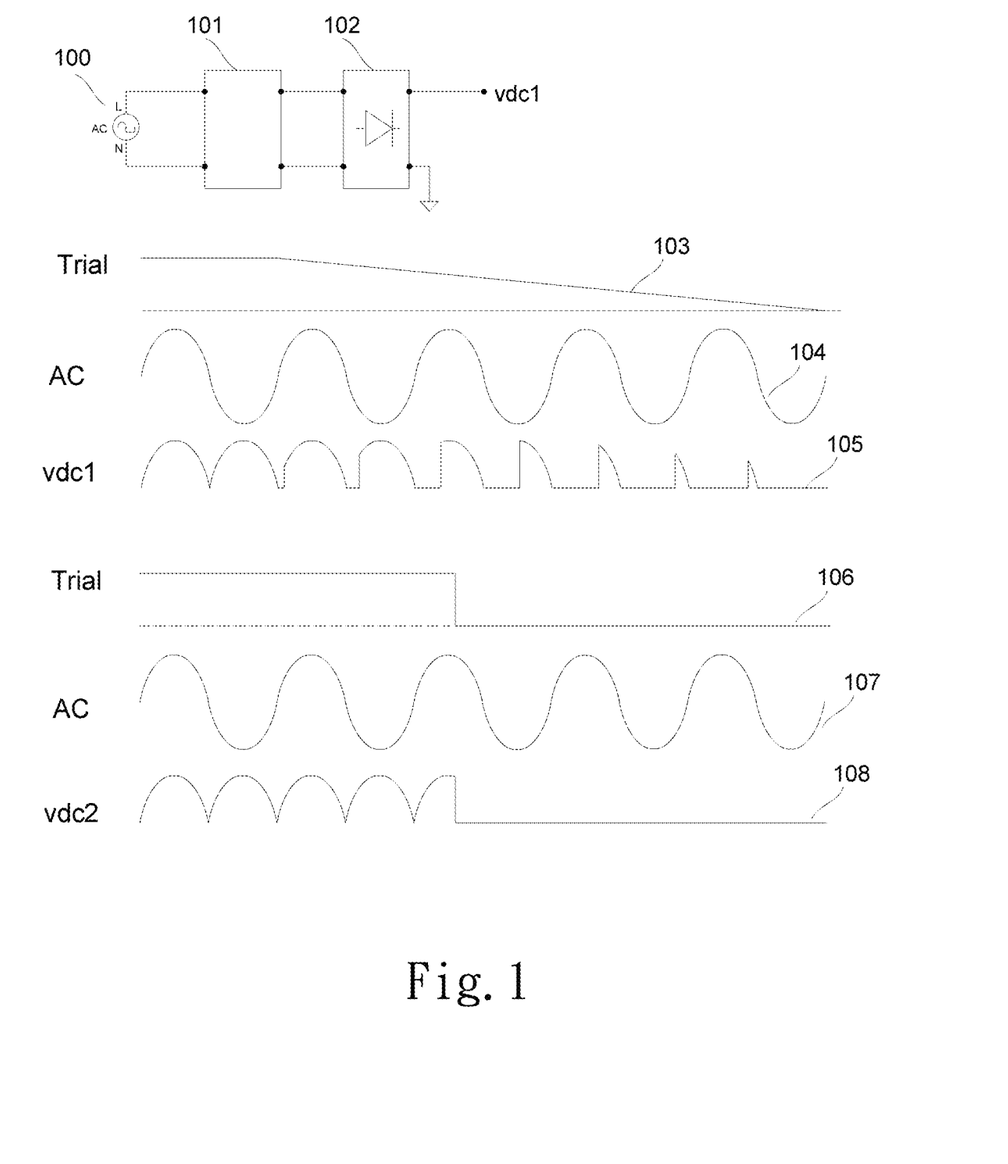
FIG. 1 shows output waveforms of a silicon-controlled dimmer.

As shown in FIG. 1, after a silicon-controlled dimmer 101 is conducted with an alternating current (AC) source 100, a waveform 103, a waveform 104 and a waveform 105 are waveforms when the silicon-controlled dimmer 101 is turned off a light through a brightness adjustment switch; and a waveform 106, a waveform 107 and a waveform 108 are waveforms when the silicon-controlled dimmer 101 is turned off the light through a push button switch. The waveform 103 represents a variation curve of the conduction angle of the silicon-controlled dimmer 101 during the time that the conduction angle is adjusted by the brightness adjustment switch from a maximum angle to a minimum angle, and the waveform 105 is the waveform of an output voltage (vdc1) of a rectifier bridge 102 corresponding to the conduction angle. The waveform 106 represents a variation curve of the conduction angle of the silicon-controlled dimmer 101 during the time that the conduction angle is adjusted by the push button switch of the silicon-controlled dimmer 101 while turning off the light, and the waveform 108 is the waveform of an output voltage (vdc2) of the rectifier bridge 102 corresponding to the conduction angle. As shown in FIG. 1 that, the output waveforms of the rectifier bridge 102 are obviously different under a first light-off mode (turning off the light through the brightness adjustment switch of the silicon-controlled dimmer) and a second light-off mode (turning off the light through the push button switch of the silicon-controlled dimmer). In the first light-off mode, the output voltage (vdc1) of the rectifier bridge 102 gradually decreases as the conduction angle of the silicon-controlled dimmer 101 gradually decreases (as the brightness adjustment switch gradually adjusts a brightness to a minimum level), that is, a conduction time becomes shorter in a power frequency period. However, in the second light-off mode, the light is turned off through the push button switch of the silicon-controlled dimmer 101, so that the output voltage (vdc2) of the rectifier bridge 102 is instantaneously cut off as the push button switch is turned off. From the comparison between the waveform 105 and the waveform 108, it can be seen that a conduction time of the output voltage (vdc1) in the first light-off mode is gradually reduced, and the output voltage (vdc2) in the second light-off mode is instantaneously reduced. Therefore, in order to solve the problem that the light-off modes of the silicon-controlled dimmer cannot be effectively distinguished, the present invention provides a detection circuit 214 for detecting the light-off modes of a silicon-controlled dimmer, wherein the detection circuit 214 effectively distinguishes the two light-off modes of the silicon-controlled dimmer based on the difference in the output waveforms between the two light-off modes.

Figure 2:
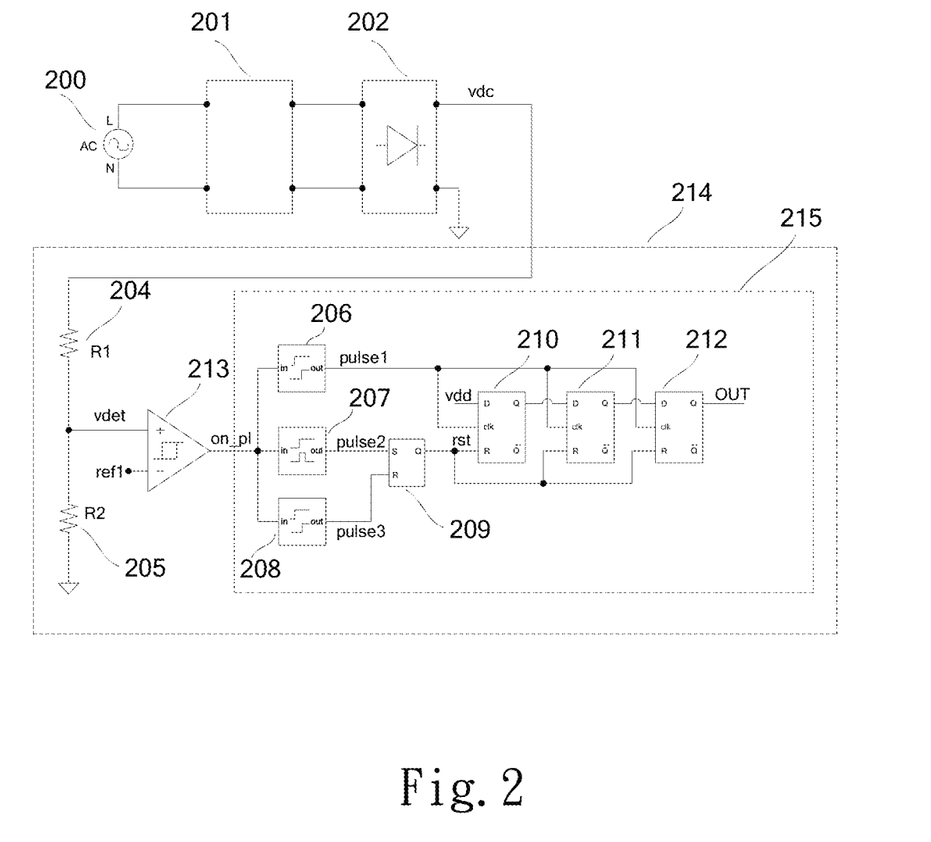
FIG. 2 is a schematic diagram of a first embodiment of a detection circuit for detecting light-off modes performed by the silicon-controlled dimmer of the present invention.

Specifically, in one embodiment, the detection circuit 214 includes a voltage detection circuit and a delay circuit 215.

In a color temperature adjustment circuit connected with a silicon-controlled dimmer 201, a first input terminal of the silicon-controlled dimmer 201 is connected to a live wire output terminal of an AC source 200, a second input terminal of the silicon-controlled dimmer 201 is connected to a neutral wire output terminal of the AC source 200, a first output terminal of the silicon-controlled dimmer 201 is connected to a first input terminal of a rectifier bridge 202, and a second output terminal of the silicon-controlled dimmer 201 is connected to a second input terminal of the rectifier bridge 202. A first output terminal of the rectifier bridge 202 is connected to an input terminal of the voltage detection circuit, and a second output terminal of the rectifier bridge 202 is grounded.

The voltage detection circuit receives an output signal and outputs a voltage detection signal according to the output signal. The delay circuit 215 is connected to the voltage detection circuit, and the delay circuit 215 receives the voltage detection signal and delays the voltage detection signal in order to output a detection signal. In the invention, the term "connected" includes "direct connection" and "indirect connection".

The detection signal (OUT) used to distinguish the light-off modes of the silicon-controlled dimmer 201 is obtained through detecting the output signal and generating the corresponding voltage detection signal to the delay circuit 215 by the voltage detection circuit, and delaying the received voltage detection signal by the delay circuit 215.

Accordingly, when the detection signal output by the delay circuit 215 changes from a low level to a high level, it means that the silicon-controlled dimmer 201 turns off the light in the first light-off mode; when the detection signal output by the delay circuit 215 remains at a low level, it means that the silicon-controlled dimmer 201 turns off the light in the second light-off mode.

First Embodiment

As shown in FIG. 2, in the embodiment, the voltage detection circuit includes a first voltage divider circuit connected to the first output terminal of the rectifier bridge 202, and a first comparator 213 connected to the first voltage divider circuit. The first voltage divider circuit receives a rectified signal output from the first output terminal of the rectifier bridge 202 and divides a voltage of the rectified signal to output a first divided voltage signal. The first comparator 213 receives the first divided voltage signal and outputs a first comparison signal according to the first divided voltage signal, wherein the rectified signal is the output signal, and the first comparison signal is the voltage detection signal.

In the embodiment, the first voltage divider circuit is implemented by a series resistor. As shown in FIG. 2, the first voltage divider circuit includes a first voltage divider resistor 204 (R1) and a second voltage divider resistor 205 (R2).

Specifically, as shown in FIG. 2, a first terminal of the first voltage divider resistor 204 is served as an input terminal of the detection circuit 214 which connects with the first output terminal of the rectifier bridge 202. A second terminal of the first voltage divider resistor 204 is connected to a first terminal of the second voltage divider resistor 205. A connection terminal of the second terminal of the first voltage divider resistor 204 and the first terminal of the second voltage divider resistor 205 is connected to a positive input terminal of the first comparator 213. A negative input terminal of the first comparator 213 is connected to a first reference voltage (ref1). An output terminal of the first comparator 213 is connected to an input terminal of the delay circuit 215.

Further, in the embodiment, the delay circuit 215 includes a delay module, a reset module and a counter.

The delay module is connected to the voltage detection circuit to receive the voltage detection signal, and the delay module delays the voltage detection signal to output a delay signal. The reset module is connected to the delay module to receive the delay signal, and the reset module generates a reset signal according to the delay signal. The counter is connected to the delay module and the reset module to receive the delay signal and the reset signal, and the counter outputs the detection signal according to the delay signal and the reset signal.

In the embodiment, the delay module is implemented by a conventional delay method or circuit, wherein a delay time of the delay module is selected and determined according to an actual circuit, and is not specifically limited in the present invention.

Further, as shown in FIG. 2, the delay module includes a first delay module 206, a second delay module 207 and a third delay module 208 disposed in parallel.

An input terminal of the first delay module 206, an input terminal of the second delay module 207, and an input terminal of the third delay module 208 are all connected to an output terminal of the voltage detection circuit (the output terminal of the first comparator 213). An output terminal of the first delay module 206 is connected to clock input terminals of the counter, an output terminal of the second delay module 207 is connected to a second input terminal of the reset module 209, an output terminal of the third delay module 208 is connected to a first input terminal of the reset module 209. An output terminal of the reset module 209 is connected to reset terminals of the counter.

As shown in FIG. 2, in the embodiment, the reset module 209 is an RS flip-flop (set/reset flip-flop), wherein the first input terminal of the reset module 209 is a first input terminal (R) of the RS flip-flop, and the second input terminal of the reset module 209 is a second input terminal (S) of the RS flip-flop.

Further, the counter in the embodiment of the present invention is implemented by a D flip-flop (delay flip-flop).

As shown in FIG. 2, in the embodiment, the counter includes a first D flip-flop 210, a second D flip-flop 211, and a third D flip-flop 212.

A clock input terminal (clk) of the first D flip-flop 210, a clock input terminal (clk) of the second D flip-flop 211, and a clock input terminal (clk) of the third D flip-flop 212 are all connected to the output terminal of the first delay module 206. A reset terminal (R) of the first D flip-flop 210, a reset terminal (R) of the second D flip-flop 211, and a reset terminal (R) of the third D flip-flop 212 are all connected to the output terminal of the reset module 209.

An output terminal of the first D flip-flop 210 is connected to a power supply terminal of the second D flip-flop 211, an output terminal of the second D flip-flop 211 is connected to a power supply terminal of the third D flip-flop 212, and an output terminal of the third D flip-flop 212 outputs the detection signal.

The clock input terminal (clk) of the first D flip-flop 210, the clock input terminal (clk) of the second D flip-flop 211, and the clock input terminal (clk) of the third D flip-flop 212 are the clock input terminals of the counter. The reset terminal (R) of the first D flip-flop 210, the reset terminal (R) of the second D flip-flop 211 and the reset terminal (R) of the third D flip-flop 212 are the reset terminals of the counter.

As shown in FIG. 2, a level of the detection signal output by the output terminal of the delay circuit 215 represents the light-off mode of the silicon-controlled dimmer 201. When the detection signal changes from a low level to a high level, it indicates that the light-off mode of the silicon-controlled dimmer 201 is the first light-off mode (turning off the light through the brightness adjustment switch adjusting a brightness to a minimum gradually); if the detection signal remains at a low level, it indicates that the light-off mode of the silicon-controlled dimmer 201 is the second light-off mode (turning off the light through the push button switch of the silicon-controlled dimmer). After the first voltage divider circuit divides a voltage (vdc) output by the rectifier bridge 202, the first comparator 213 compares the voltage of the first divided voltage signal with a threshold voltage (vth1), when the voltage (vdc) is greater than the threshold voltage (vth1), a comparison signal (on_pl) output from the output terminal of the first comparator 213 is a high level, otherwise it is a low level. The threshold voltage (vth1) shown in FIG. 3 is related to the first voltage divider resistor 204 (R1), the second voltage divider resistor 205 (R2), and the first reference voltage (ref1), for example, R2/(R1+R2) *vth1=ref1.

Figure 3:
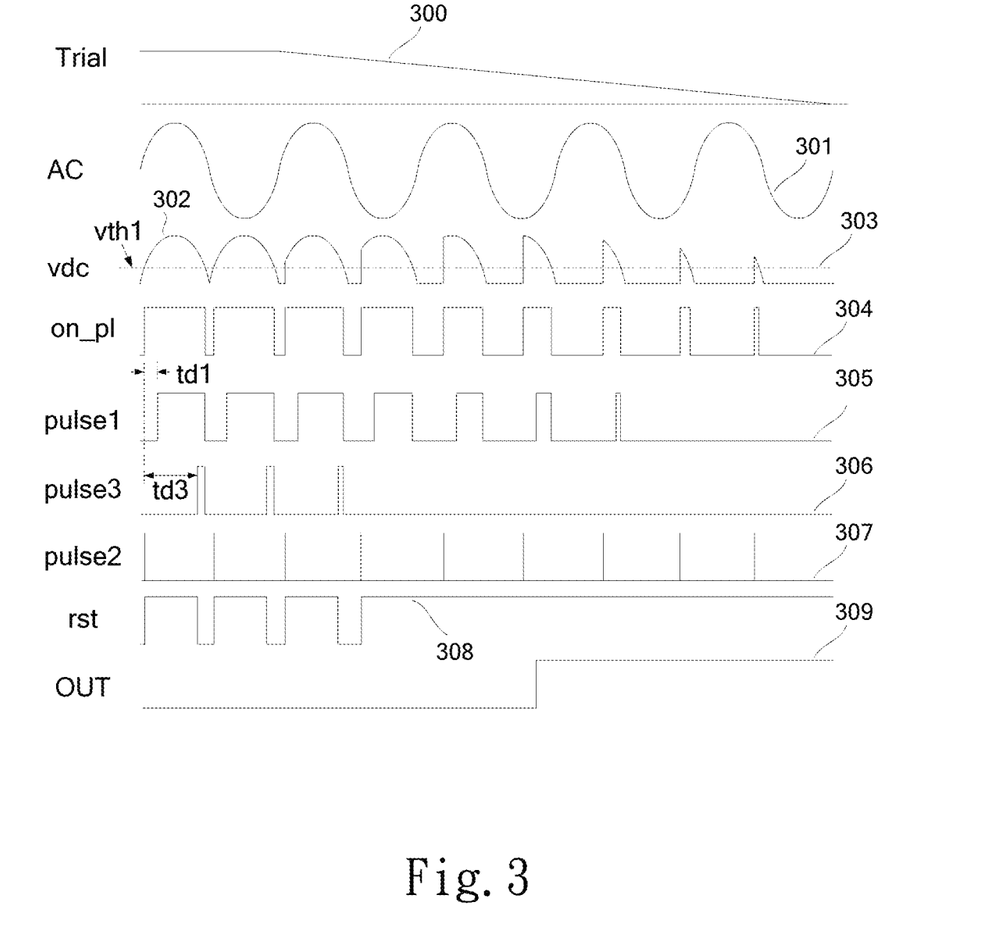
FIG. 3 is a waveform of a first light-off mode performed by the silicon-controlled dimmer corresponding to FIG. 2.

As shown in FIG. 3, the high level of the comparison signal (on_pl) output by the first comparator 213 corresponds to the conduction angle output by the silicon-controlled dimmer 201. The delay circuit 215 detects a duration of the high level of the comparison signal (on_pl). After the comparison signal (on_pl) passes through the first delay module 206, the second delay module 207, and the third delay module 208, a first delay signal (pulse1), a second delay signal (pulse2) and a third delay signal (pulse3) are generated respectively. The first delay module 206 has a delay time (td1), and the third delay module 208 has a delay time (td3). The delay time (td1) is used to filter out the noise of the voltage (vdet) caused by the voltage (vdc), if the duration of the high level of the comparison signal (on_pl) is less than the delay time (td1), it will be filtered out as noise. The delay time (td3) is used as a detection threshold of a conduction time of the silicon-controlled dimmer 201. The counter is composed of the first D flip-flop 210, the second D flip-flop 211 and the third D flip-flop 212, and the first delay signal (pulse1) is input to a clock input terminal of the counter. The reset signal is an output signal (rst) of the RS flip-flop, and signals of the first input terminal (R) and the second input terminal (S) of the RS flip-flop are the second delay signal (pulse2) and the third delay signal (pulse3), respectively. It can be seen from the waveforms shown in FIG. 3 that when a rising edge of the comparison signal (on_pl) occurs, a rising edge of the second delay signal (pulse2) appears at the same time, and the second delay signal (pulse2) sets an output signal of the RS flip-flop to "1", so that the counter starts to get ready to count. After the comparison signal (on_pl) is delayed by the delay time (td1), the first delay signal (pulse1) appears and the first delay signal (pulse1) is used as a clock signal of the counter, and the counter starts recording a first pulse. If a duration of the comparison signal (on_pl) is long enough (the duration is greater than the delay time (td3)), the third delay signal (pulse3) sets the output signal of the RS flip-flop to "0", so that the output signal (rst) is a low level, the counter is reset, and a count result is cleared. As the conduction angle of the silicon-controlled dimmer 201 becomes smaller and smaller, that is, when the duration of a high level of the comparison signal (on_pl) is less than the delay time (td3), the third delay signal (pulse3) will not appear, and the counter will not be reset. A quantity of pulses of the first delay signal (pulse1) is recorded by the counter, and when a quantity of pulses of the first delay signal (pulse1) appears three consecutive times, the detection signal output by the counter changes from a low level to a high level, which means that the silicon-controlled dimmer 201 turns off the light in the first light-off mode.

In FIG. 3, a waveform 300 is the conduction angle waveform of the silicon-controlled dimmer 201, a waveform 301 is the waveform of the AC source 200, a waveform 302 is the output waveform of the rectifier bridge 202, a waveform 303 is the waveform of the threshold voltage (vth1), a waveform 304 is the waveform of the comparison signal (on_pl), a waveform 305 is the waveform of the first delay signal (pulse1), a waveform 306 is the waveform of the third delay signal (pulse3), a waveform 307 is the waveform of the second delay signal (pulse2), a waveform 308 is the waveform of the output signal (rst) output by the RS flip-flop, and a waveform 309 is the waveform output by the counter. As shown in FIG. 3, the waveform 309 output by the counter changes from a low level to a high level, indicating that the silicon-controlled dimmer 201 turns off the light in the first light-off mode.

Figure 4:
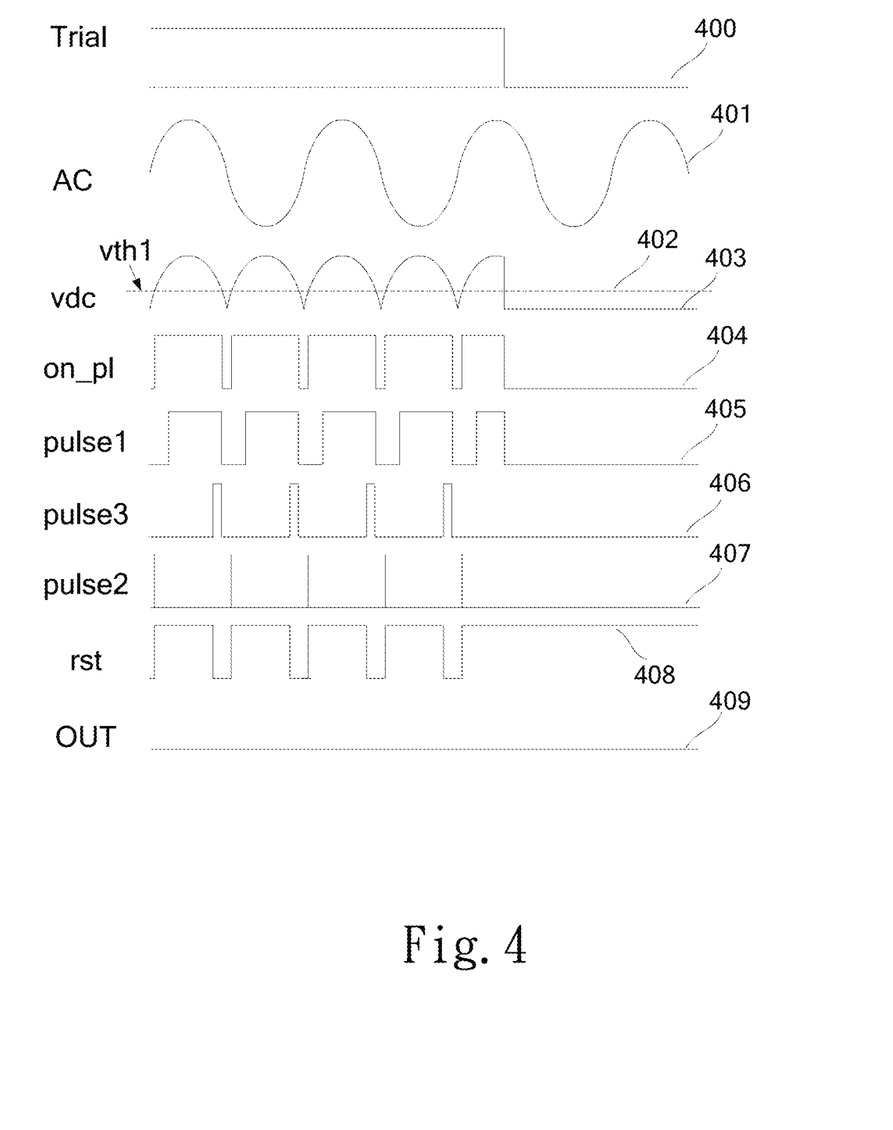
FIG. 4 is a waveform of a second light-off mode performed by the silicon-controlled dimmer corresponding to FIG. 2.

Waveforms shown in FIG. 4 are the corresponding waveforms when the silicon-controlled dimmer 201 turns off the light in the second light-off mode. As shown in FIG. 4, the comparison signal (on_pl) remains in high level instead of gradually decreasing. However, once the light is turned off, no comparison signal (on_pl) in high level will be generated. At this time, the output signal (rst) will no longer be in a high level since no hopping will occurs in the second delay signal (pulse2) anymore, so that the counter will not enter the counting state. In addition, the first delay signal (pulse1) and the third delay signal (pulse3) are maintained in low level, so it would not consecutively appear three first delay signals (pulse1) as shown in FIG. 3 when the output signal (rst) is maintained in a high level. Therefore, the signal output by the counter is kept at a low level, which indicates that the silicon-controlled dimmer 201 turns off the light in the second light-off mode.

In FIG. 4, a waveform 400 is the conduction angle waveform of the silicon-controlled dimmer 201, a waveform 401 is the waveform of the AC source 200, a waveform 403 is the output waveform of the rectifier bridge 202, a waveform 402 is the waveform of the threshold voltage (vth1), a waveform 404 is the waveform of the comparison signal (on_pl), a waveform 405 is the waveform of the first delay signal (pulse1), a waveform 406 is the waveform of the third delay signal (pulse3), a waveform 407 is the waveform of the second delay signal (pulse2), a waveform 408 is the waveform of the output signal (rst) output by the RS flip-flop, and a waveform 409 is the waveform output by the counter. As shown in FIG. 4, the waveform 409 output by the counter is kept at a low level, indicating that the silicon-controlled dimmer 201 turns off the light in the second light-off mode.

Second Embodiment

Figure 7:
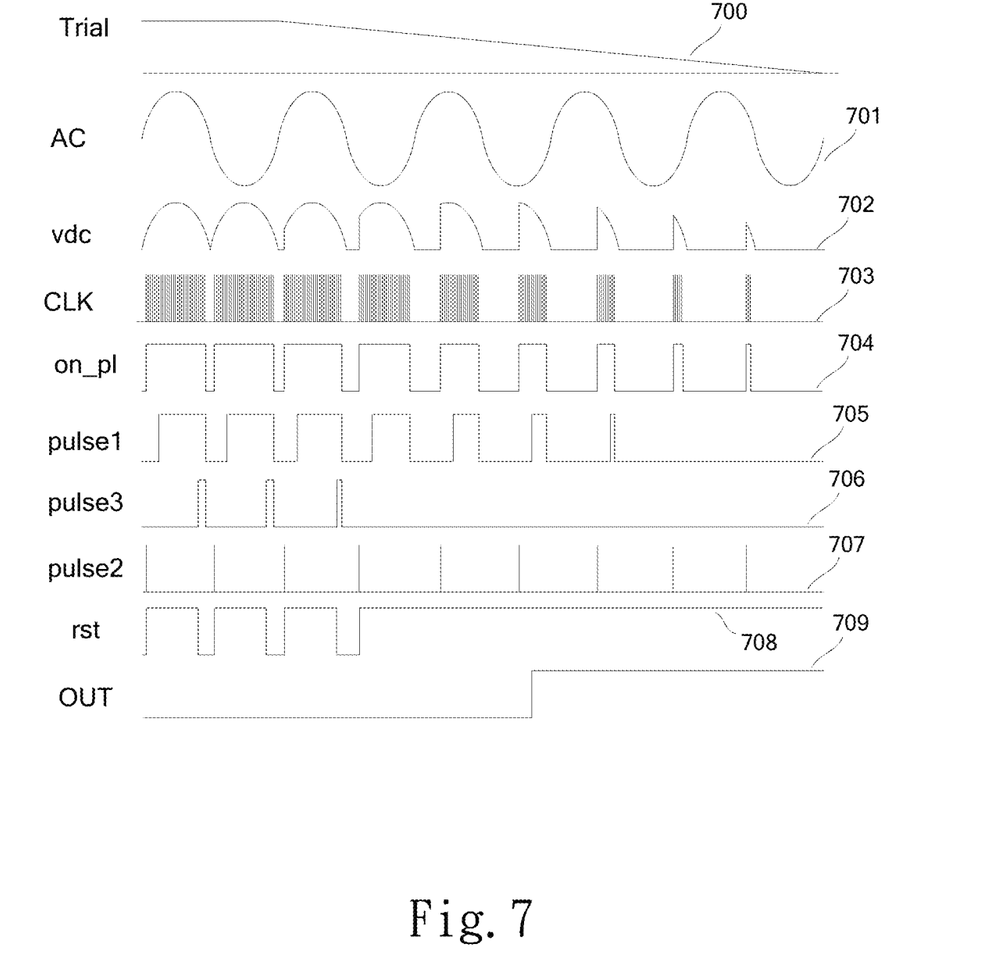
FIG. 7 is a waveform of the first light-off mode performed by the silicon-controlled dimmer corresponding to FIG. 6.

In the embodiment, the detection circuit 214 is capable of detecting a waveform of an oscillating signal in a driving power source (such as LED driving power source) compatible with the silicon-controlled dimmer, so as to detect changes of a conduction angle of the voltage (vdc) output by the rectifier bridge 202, thereby determining the light-off mode performed by the silicon-controlled dimmer 201. A waveform 703 of an oscillating signal (CLK) is shown in FIG. 7, and the waveform 703 is a high-frequency pulse waveform which appears within a conduction angle of the silicon-controlled dimmer 201.

Figure 6:
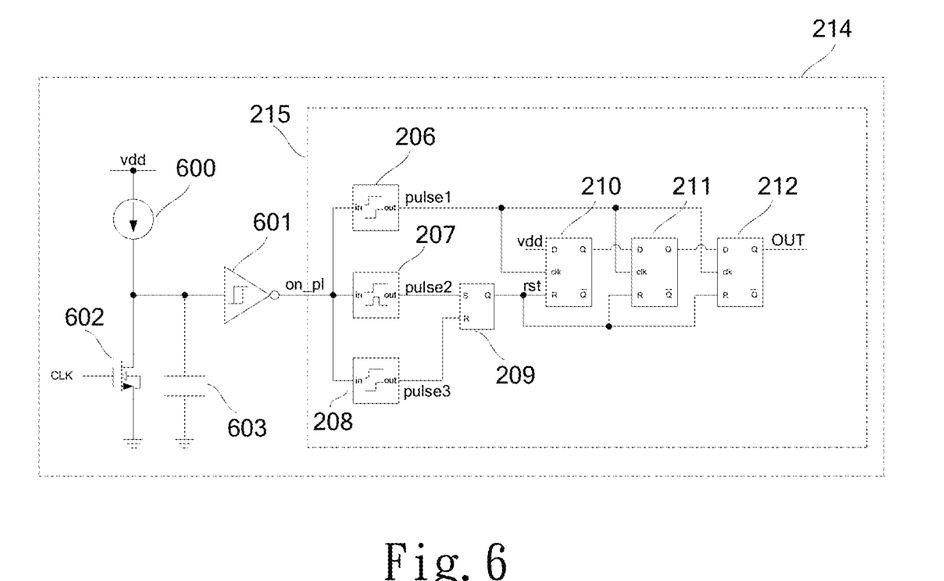
FIG. 6 is a schematic diagram of a second embodiment of the detection circuit for detecting light-off modes performed by a silicon-controlled dimmer of the present invention.

As shown in FIG. 6, in the embodiment, the voltage detection circuit includes a waveform detection circuit and a logic gate circuit.

The waveform detection circuit is connected to an output terminal of the driving power source compatible with the silicon-controlled dimmer 201 to receive the oscillating signal (CLK) and output a voltage signal according to the oscillating signal (CLK). The logic gate circuit is connected to the waveform detection circuit to logically process the voltage signal and output a logic signal. In the embodiment, the oscillating signal (CLK) is the aforementioned output signal, and the logic signal is the aforementioned voltage detection signal.

As shown in FIG. 6, in the embodiment, the waveform detection circuit includes a current source 600, an N-channel Metal Oxide Semiconductor (NMOS) transistor 602 and a capacitor 603. The logic gate circuit includes a NOT gate 601. An output terminal of the current source 600 is connected to a drain of the NMOS transistor 602, a grid of the NMOS transistor 602 is connected to the output terminal of the driving power source, a source of the NMOS transistor 602 is grounded. A first terminal of the capacitor 603 and an input terminal of the NOT gate 601 are connected to the output terminal of the current source 600, a second terminal of the capacitor 603 is grounded, and an output terminal of the NOT gate 601 is connected to the input terminal of the delay circuit 215.

Figure 5:
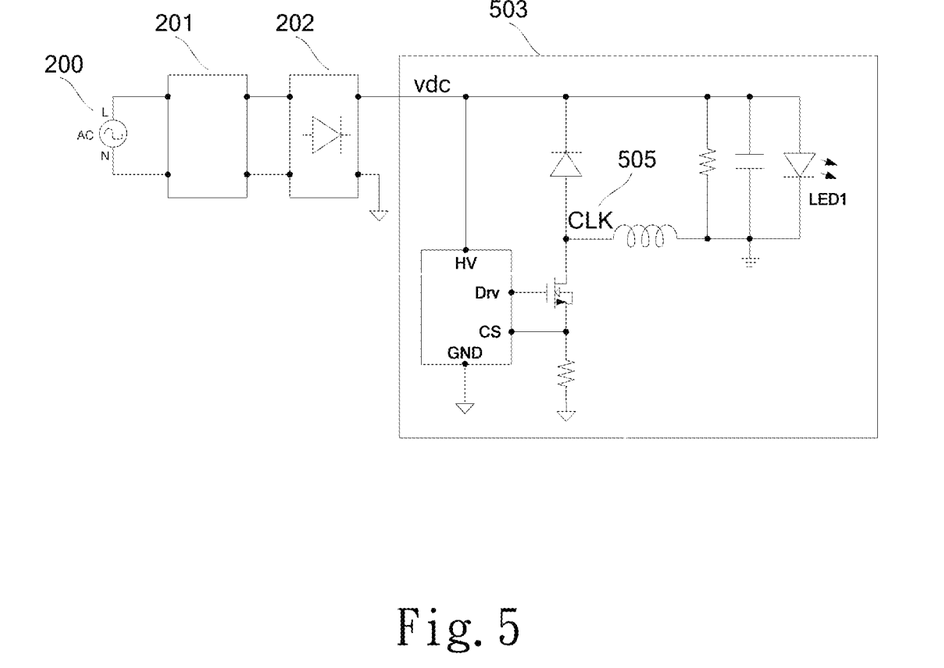
FIG. 5 is a schematic diagram of a LED driving power source compatible with the silicon-controlled dimmer circuit.

Further, in the embodiment, a circuit of a driving power source 503 compatible with the silicon-controlled dimmer 201 is shown in FIG. 5. Specifically, the first input terminal of the silicon-controlled dimmer 201 is connected to the live wire output terminal of the AC source 200, the second input terminal of the silicon-controlled dimmer 201 is connected to the neutral wire output terminal of the AC source 200, the first output terminal of the silicon-controlled dimmer 201 is connected to the first input terminal of the rectifier bridge 202, the second output terminal of the silicon-controlled dimmer 201 is connected to the second input terminal of the rectifier bridge 202. The first output terminal of the rectifier bridge 202 is connected to a power supply input terminal of the driving power source 503, and the second output terminal of the rectifier bridge 202 is grounded. A driving chip of the driving power source 503 outputs an oscillating signal (CLK) 505 through its driving pins.

As shown in FIG. 5 and FIG. 6, the oscillating signal (CLK) 505 is input into the voltage detection circuit composed of the current source 600, the NMOS transistor 602, the capacitor 603, and the NOT gate 601 (the NOT gate is a hysteretic NOT gate). A signal output by the NOT gate 601 is the voltage detection signal, and a waveform 704 of the voltage detection signal is shown in FIG. 7. The voltage detection signal is input into the delay circuit 215, wherein the delay circuit 215 is the same as the delay circuit 215 in the first embodiment, so that the operational principle of the delay circuit 215 is the same as that of the first embodiment. In the embodiment, the voltage detection circuit is different from that of the first embodiment. Since the second embodiment detects the oscillating signal (CLK) 505 output by the driving power source 503, but the first embodiment detects the output signal output by the rectifier bridge 202, so it is necessary to use the different voltage detection circuits. FIG. 7 is a waveform diagram of the first light-off mode of the silicon-controlled dimmer 201, and FIG. 8 is a waveform diagram of the second light-off mode of the silicon-controlled dimmer 201.

In FIG. 7, a waveform 700 is the conduction angle waveform of the silicon-controlled dimmer 201, a waveform 701 is the waveform of the AC source 200, a waveform 702 is the output waveform of the rectifier bridge 202, a waveform 703 is the waveform of the oscillating signal (CLK) 505, a waveform 705 is the waveform of the first delay signal (pulse1), a waveform 706 is the waveform of the third delay signal (pulse3), a waveform 707 is the waveform of the second delay signal (pulse2), a waveform 708 is the waveform of the output signal (rst), and a waveform 709 is a waveform output by the counter.

Figure 8:
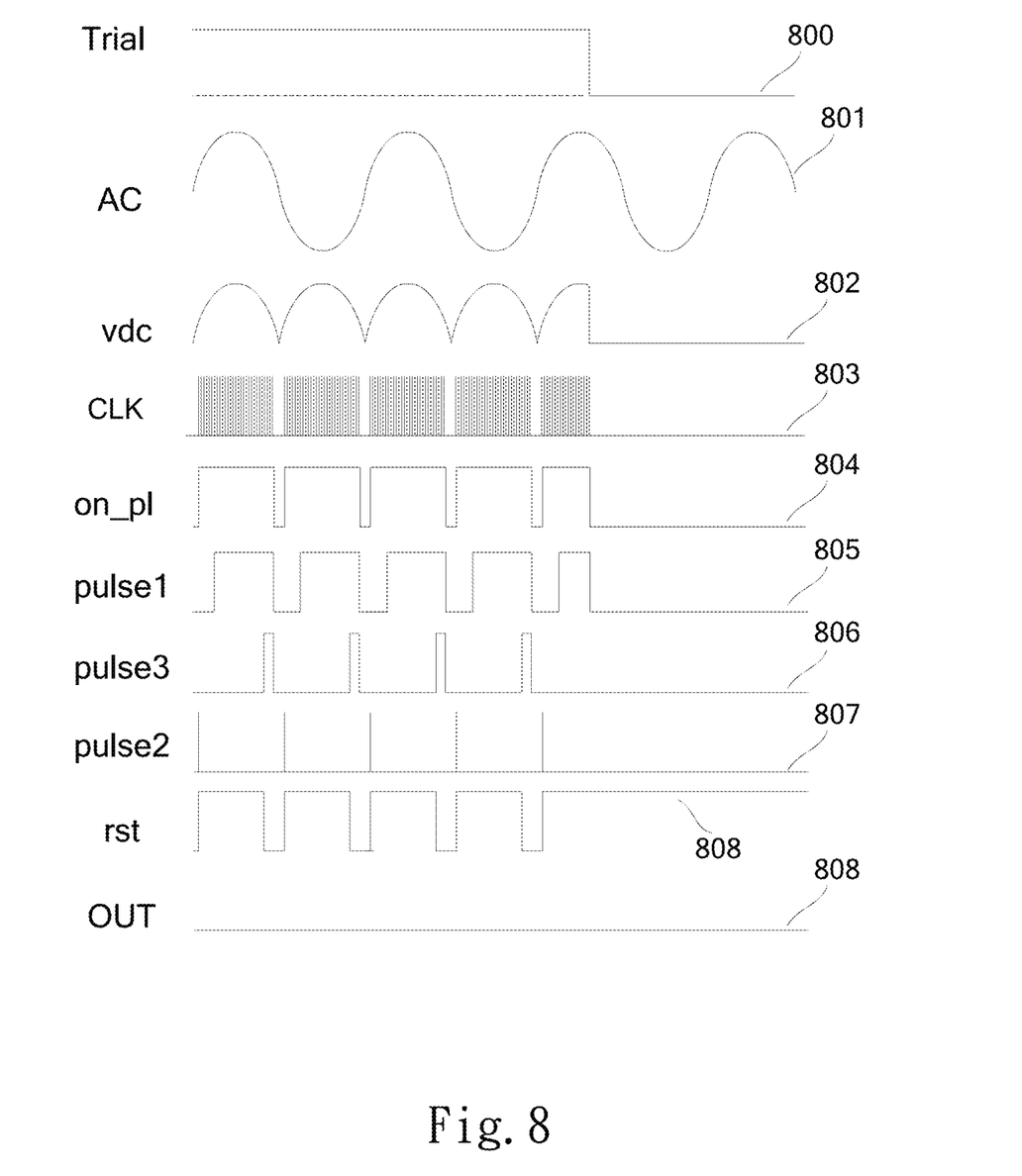
FIG. 8 is a waveform of the second light-off mode performed by the silicon-controlled dimmer corresponding to FIG. 6.

In FIG. 8, a waveform 800 is a conduction angle waveform of the silicon-controlled dimmer 201, a waveform 801 is the waveform of the AC source 200, a waveform 802 is the output waveform of the rectifier bridge 202, a waveform 803 is the waveform of the oscillating signal (CLK) 505, a waveform 804 is the waveform of the comparison signal (on_pl), a waveform 805 is the waveform of the first delay signal (pulse1), a waveform 806 is the waveform of the third delay signal (pulse3), a waveform 807 is the waveform of the second delay signal (pulse2), a waveform 808 is the waveform of the output signal (rst), and a waveform 809 is the waveform output by the counter.

Third Embodiment

Figure 9:
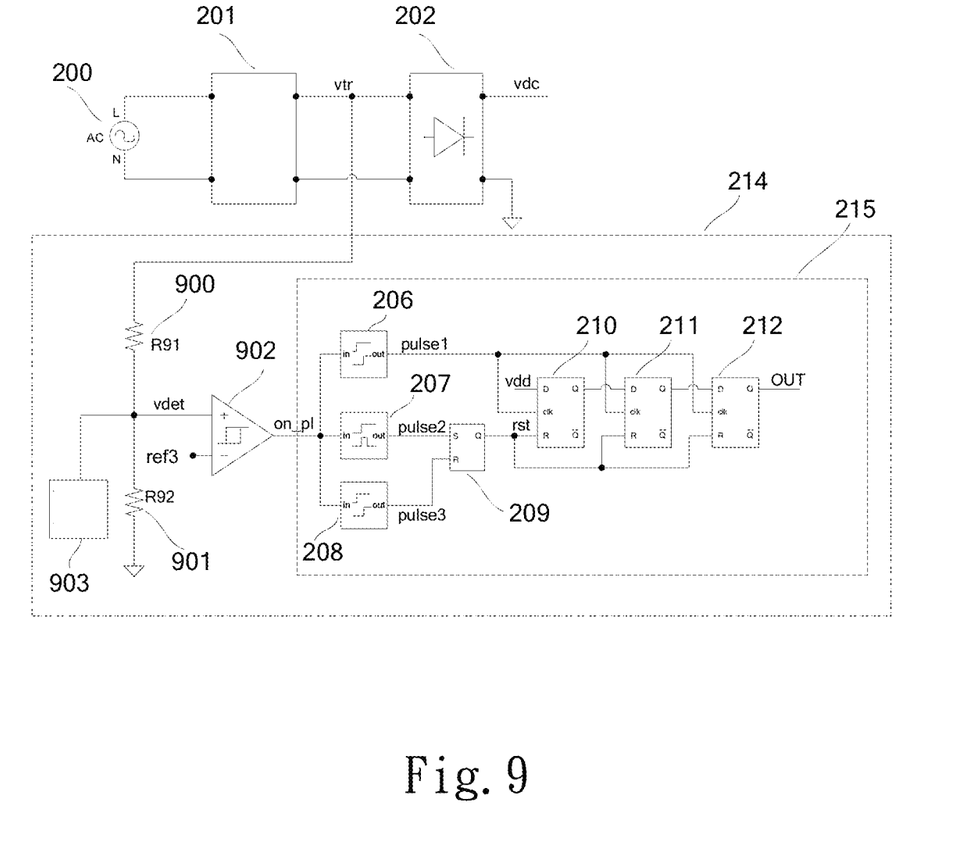
FIG. 9 is a schematic diagram of a third embodiment of the detection circuit for detecting light-off modes performed by a silicon-controlled dimmer of the present invention.

The voltage detection circuit includes a second voltage divider circuit, a low-voltage clamping circuit 903, and a second comparator 902.

The second voltage divider circuit is connected to the first output terminal of the silicon-controlled dimmer 201 to receive a conduction signal of the silicon-controlled dimmer 201 and output a second divided voltage signal according to the conduction signal. The low-voltage clamping circuit 903 is connected to the second voltage divider circuit to clamp the second divided voltage signal. The second comparator 902 is connected to the second voltage divider circuit to receive the second divided voltage signal and output a second comparison signal according to the second divided voltage signal. In the embodiment, the conduction signal is the aforementioned output signal; and the second comparison signal is the aforementioned voltage detection signal. The second comparator 902 is a hysteretic comparator.

Specifically, as shown in FIG. 9, the second voltage divider circuit includes a third voltage divider resistor 900 (R91) and a fourth voltage divider resistor 901 (R92). A first terminal of the third voltage divider resistor 900 is connected to the first output terminal of the silicon-controlled dimmer 20. A second terminal of the third voltage divider resistor 900 is connected to a first terminal of the fourth voltage divider resistor 901. A connection terminal of the second terminal of the third voltage divider resistor 900 and the first terminal of the fourth voltage divider resistor 901 is connected to a positive input terminal of the second comparator 902 and the low-voltage clamping circuit 903, and a second terminal of the fourth voltage divider resistor 901 is grounded. A negative input terminal of the second comparator 902 is connected to the first reference voltage (ref1), and an output terminal of the second comparator 902 is connected to an input terminal of the delay circuit 215, wherein the delay circuit 215 of this embodiment is the same as the delay circuit 215 of the first embodiment.

Figure 10:
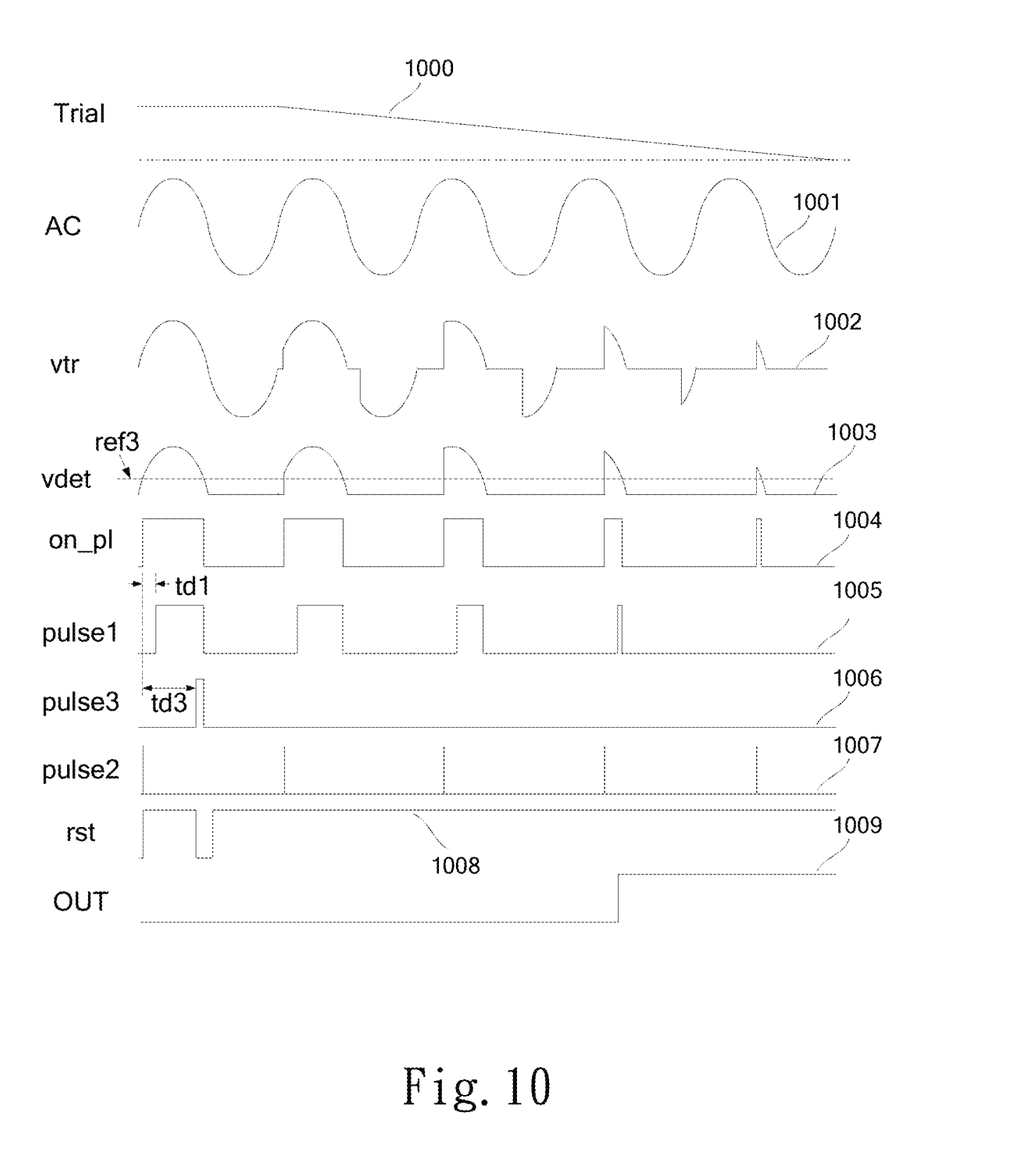
FIG. 10 is a waveform of the first light-off mode performed by the silicon-controlled dimmer corresponding to FIG. 9.

Further, as shown in FIG. 9, the embodiment is implemented by detecting an output signal (vtr) (i.e., the conduction signal) of the silicon-controlled dimmer 201. Specifically, the output signal (vtr) is input into the voltage detection circuit composed of the third voltage divider resistor 900, the fourth voltage divider resistor 901, the low-voltage clamping circuit 903, and the second comparator 902. A signal output by the voltage detection circuit is the comparison signal (on_pl), and the comparison signal (on_pl) is input into the delay circuit 215. Referring to a waveform 1002 shown in FIG. 10, since the output signal (vtr) is generated before the rectifier bridge 202, a negative voltage is existed in the output signal (vtr). In order to protect a positive input pole of the second comparator 902, the low-voltage clamping circuit 903 is added to the positive input pole of the second comparator 902 to ensure that no negative voltage exists in an input signal of the second comparator 902. The difference between the embodiment and the first embodiment is that the low-voltage clamping circuit 903 is added to the voltage detection circuit, and the delay circuit 215 is the same as the delay circuit 215 of the first embodiment, and therefore, the operational principle of the delay circuit 215 is the same as the operational principle of the first embodiment. FIG. 10 shows waveforms of the first light-off mode of the silicon-controlled dimmer 201, and FIG. 11 shows waveforms of the second light-off mode of the silicon-controlled dimmer 201.

Specifically, in FIG. 10, a waveform 1000 is the conduction angle waveform of the silicon-controlled dimmer 201, a waveform 1001 is the waveform of the AC source 200, a waveform 1002 is the waveform of the output signal (vtr), a waveform 1003 is the waveform of the voltage (vdet), a waveform 1004 is the waveform of the comparison signal (on_pl), a waveform 1005 is the waveform of the first delay signal (pulse1), a waveform 1006 is the waveform of the third delay signal (pulse3), a waveform 1007 is the waveform of the second delay signal (pulse2), a waveform 1008 is the waveform of the output signal (rst), and a waveform 1009 is the waveform output by the counter.

Figure 11:
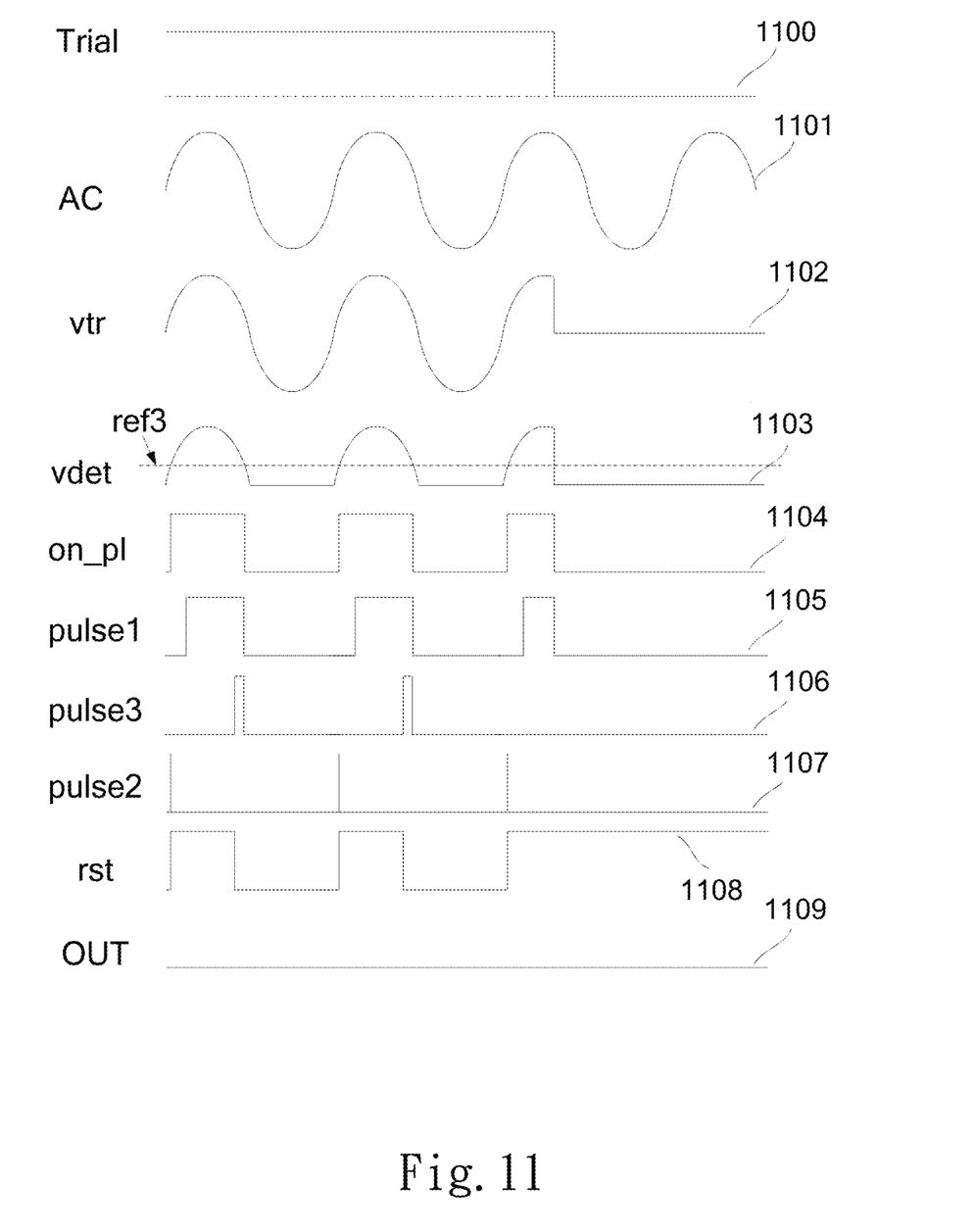
FIG. 11 is a waveform of the second light-off mode performed by the silicon-controlled dimmer corresponding to FIG. 9.

In FIG. 11, a waveform 1100 is the conduction angle waveform of the silicon-controlled dimmer 201, a waveform 1101 is the waveform of the AC source 200, a waveform 1102 is the waveform of the output signal (vtr), a waveform 1103 is a waveform of the voltage (vdet), a waveform 1104 is the waveform of the comparison signal (on_pl), a waveform 1105 is the waveform of the first delay signal (pulse1), a waveform 1106 is the waveform of the third delay signal (pulse3), a waveform 1107 is the waveform of the second delay signal (pulse2), a waveform 1108 is the waveform of the output signal (rst), and a waveform 1109 is the waveform output by the counter.

What is claimed is:

1. A detection circuit for detecting light-off modes performed by a silicon-controlled dimmer, comprising:
   a voltage detection circuit, receiving an output signal and generating a voltage detection signal according to the output signal; and
   a delay circuit, including a delay module connected to the voltage detection circuit, a reset module connected to the delay module, and a counter connected to the delay module and the reset module, wherein the delay module receives the voltage detection signal and delays the voltage detection signal to output a delay signal, and wherein the reset module receives the delay signal and generates a reset signal according to the delay signal, and wherein the counter receives the delay signal and the reset signal, and the counter outputs a detection signal according to the delay signal and the reset signal to distinguish light-off modes of the silicon-controlled dimmer.

2. The detection circuit as claimed in claim 1, wherein the delay module includes a first delay module, a second delay module and a third delay module disposed in parallel, wherein an input terminal of the first delay module, an input terminal of the second delay module, and an input terminal of the third delay module are all connected to an output terminal of the voltage detection circuit, and wherein an output terminal of the first delay module is connected to clock input terminals of the counter, an output terminal of the second delay module is connected to a second input terminal of the reset module, an output terminal of the third delay module is connected to a first input terminal of the reset module, and an output terminal of the reset module is connected to reset terminals of the counter.

3. The detection circuit as claimed in claim 1, wherein the reset module is an RS flip-flop.

4. The detection circuit as claimed in claim 1, wherein the counter includes a plurality of D flip-flops disposed in parallel.

5. The detection circuit as claimed in claim 2, wherein the counter includes a first D flip-flop, a second D flip-flop, and a third D flip-flop, wherein a clock input terminal of the first D flip-flop, a clock input terminal of the second D flip-flop, and a clock input terminal of the third D flip-flop are all connected to the output terminal of the first delay module, and wherein a reset terminal of the first D flip-flop, a reset terminal of the second D flip-flop and a reset terminal of the third D flip-flop are all connected to the output terminal of the reset module, and wherein an output terminal of the first D flip-flop is connected to a power supply terminal of the second D flip-flop, and an output terminal of the second D flip-flop is connected to a power supply terminal of the third D flip-flop, and an output terminal of the third D flip-flop outputs the detection signal, and wherein the clock input terminal of the first D flip-flop, the clock input terminal of the second D flip-flop, and the clock input terminal of the third D flip-flop are the clock input terminals of the counter, and the reset terminal of the first D flip-flop, the reset terminal of the second D flip-flop and the reset terminal of the third D flip-flop are the reset terminals of the counter.

6. The detection circuit as claimed in claim 1, wherein the voltage detection circuit includes a first voltage divider circuit connected to a first output terminal of a rectifier bridge and a first comparator connected to the first voltage divider circuit, and wherein the first voltage divider circuit receives a rectified signal output from the first output terminal of the rectifier bridge, and divides a voltage of the rectified signal to output a first divided voltage signal, and wherein the first comparator receives the first divided voltage signal, and outputs a first comparison signal according to the first divided voltage signal, and wherein the rectified signal is the output signal, and the first comparison signal is the voltage detection signal.

7. The detection circuit as claimed in claim 1, wherein the voltage detection circuit includes a waveform detection circuit connected to an output terminal of a driving power source compatible with the silicon-controlled dimmer and a logic gate circuit connected to the waveform detection circuit, wherein the waveform detection circuit receives an oscillating signal output from the driving power source, and outputs a voltage signal according to the oscillating signal, and wherein the logic gate circuit performs a logic processing on the voltage signal to output a logic signal, and wherein the oscillating signal is the output signal, and the logic signal is the voltage detection signal.

8. The detection circuit as claimed in claim 1, wherein the voltage detection circuit includes a second voltage divider circuit connected to a first output terminal of the silicon-controlled dimmer, and a second comparator connected to the second voltage divider circuit, wherein the second voltage divider circuit receives a conduction signal of the silicon-controlled dimmer and outputs a second divided voltage signal according to the conduction signal; and wherein the second comparator receives the second divided voltage signal and outputs a second comparison signal according to the second divided voltage signal, and wherein the conduction signal is the output signal, and the second comparison signal is the voltage detection signal.

9. The detection circuit as claimed in claim 8, wherein the voltage detection circuit includes a low-voltage clamping circuit connected to the second voltage divider circuit to clamp the second divided voltage signal.

* * * * *